(12) United States Patent
Lin et al.

(10) Patent No.: US 7,768,446 B2
(45) Date of Patent: Aug. 3, 2010

(54) SIMULATING MEASUREMENT APPARATUS AND METHOD

(75) Inventors: Chunn-Yenn Lin, Longtan Shiang (TW); Li-Kuang Chen, Taipei (TW); Joseph D. S. Deng, Longtan Shiang (TW); Hsien-Kwei Ho, Jungli (TW)

(73) Assignee: Chung-Shan Institute of Science and Technology, Armaments Bureau, Ministry of National Defense, Taoyuan County (TW)

( * ) Notice: Subject to any disclaimer, the term of this patent is extended or adjusted under 35 U.S.C. 154(b) by 63 days.

(21) Appl. No.: 12/275,256

(22) Filed: Nov. 21, 2008

(65) Prior Publication Data

US 2010/0127917 A1    May 27, 2010

(51) Int. Cl.
*G01S 7/40* (2006.01)

(52) U.S. Cl. ............................. 342/169; 342/170; 434/2

(58) Field of Classification Search ......... 342/169–172; 434/2

See application file for complete search history.

(56) References Cited

U.S. PATENT DOCUMENTS 5,134,412 A * 7/1992 Baseghi et al. ............... 342/169
5,223,840 A * 6/1993 Cronyn ....................... 342/170
6,075,480 A * 6/2000 Deliberis, Jr. ............... 342/169

FOREIGN PATENT DOCUMENTS

| EP | 1450502 A2 | * | 8/2004 |
| JP | 05196719 A | * | 8/1993 |
| JP | 07311257 A | * | 11/1995 |
| JP | 2005020500 A | * | 1/2005 |
| JP | 2005223732 A | * | 8/2005 |

* cited by examiner

*Primary Examiner*—John B Sotomayor
(74) *Attorney, Agent, or Firm*—Banger Shia

(57) ABSTRACT

The invention discloses a simulating measurement apparatus. The simulating measurement apparatus comprises a storing module, a controlling module, and a simulating module. The storing module is used for storing simulating parameter information. The simulating parameter information comprises at least one emitting simulating parameter, at least one receiving simulating parameter, and a radio beam channel transmitting simulating parameter. The controlling module generates a controlling signal according to the simulating parameter information. The simulating module generates a simulating measurement result of radio beams transmitted in the space between an emitting antenna and a receiving antenna by simulating the transmitting behavior of a plurality of RF signals according to the controlling signal.

17 Claims, 3 Drawing Sheets

SIMULATING MEASUREMENT APPARATUS AND METHOD

BACKGROUND OF THE INVENTION

1. Field of the Invention

The present invention relates generally to measuring RF signals, and more particularly, the present invention relates generally to a simulating measurement apparatus and a simulating measurement method for simulating the transmitting behavior of a plurality of RF signals generated by a radio beam forming system.

2. Description of the Prior Art

Generally, there are two types of antennas. One type of antennas is omni-directional and the other type is directional. The purpose of using directional antennas is to raise the emitting power. Antenna arrays and signal processing circuits compose of a radio beam forming system in order to adjust the directional antenna for improving the performance of wireless communication system.

Traditionally, a method for evaluating performance of a radio beam forming system is to note down the quality of signals measured in all directions detailed while different radio beams are formed by a radio beam forming system in a non-reflection chamber.

The evaluating method can be executed without special arts but it costs a lot in manpower and money besides the rental for a place. A lot of workers are needed to connect antenna arrays to the RF output ports of the radio beam forming system and to set them on a rotatable platform. Thereafter, the workers set an RF signals measurement apparatus with a proper distance to the platform.

Thereafter, the displacement of emitting port relative to receiving port is simulated by rotating the platform and the workers read measured data displayed on a meter. Moreover, some automatic testing apparatuses can give an order to rotate the platform. The apparatuses read and record data automatically for evaluating the performance of the radio beam forming system.

Addition to a rental for the place and working hours, it needs a field trial in real space to get the Gain of the radio beam forming system. The field trial needs to be proceeded in a specific real space which satisfies all conditions. The local channel effect will be changed by the weather or buildings and thus the measurement result of field trail is not repeatable.

Therefore, the present invention provides a simulating measurement apparatus and a method for solving the problem mentioned above.

SUMMARY OF THE INVENTION

The present invention provides a simulating measurement apparatus and a simulating measurement method for simulating the transmitting behavior of a plurality of RF signals generated by a radio beam forming system.

Accordingly, an aspect of the present invention provides a simulating measurement apparatus. According to one embodiment of the present invention, the simulating measurement apparatus for a radio beam forming system generates a simulating measurement result by simulating the transmitting behavior of a plurality of RF signals. The radio beam forming system is used to emit a plurality of RF signals from an emitting apparatus to a receiving apparatus.

In practice, the emitting apparatus comprises a plurality of emitting units and each of the plurality of emitting units emits one of the plurality of RF signals individually. Moreover, each of the plurality of RF signals has its individual amplitude and phase.

In one embodiment, the simulating measurement apparatus comprises a storing module, a controlling module, and a simulating module. The storing module for storing a simulating parameter information that comprises at least one emitting simulating parameter, at least one receiving simulating parameter, and a radio beam channel transmitting simulating parameter. The controlling module connects to the storing module for generating a controlling signal according to the simulating parameter information. In practice, the controlling module is a computer system or an embedded microprocessor. The simulating module connects to the controlling module for generating a simulating measurement result by simulating the transmitting behavior of the plurality of RF signals according to the controlling signal. In practice, each of the at lease one signal processing units processes one of the plurality of RF signals individually. Each of the at least one signal processing units comprises a phase shifter and a RF attenuator individually.

Another aspect of the present invention provides a simulating measurement method. According to another embodiment of the present invention, the simulating measurement method is what a radio forming system uses to emit a plurality of RF signals from an emitting apparatus to a receiving apparatus.

In practice, the emitting apparatus comprises a plurality of emitting units and each of the plurality of emitting units emits one of the plurality of RF signals individually. Moreover, each of the plurality of RF signals has its individual amplitude and phase.

Initially, the simulating measurement method is to input the simulating parameter information that comprises at least one emitting apparatus simulating parameter, at least one receiving apparatus simulating parameter, and a radio beam channel transmitting simulating parameter. Thereafter, the simulating measurement method is to generate a simulating measurement result by simulating the transmitting behavior of the plurality of RF signals according to the simulating parameter information.

In practice, the simulating method is to proceed an attenuating process and a phase shifting for each of the plurality RF signals individually, and to generate a simulating measurement by adding to the plurality of RF signals.

Compared to the prior art, the simulating measurement apparatus and method of the invention is to generate a simulating measurement result by simulating the transmitting behavior of a plurality of RF signals in radio beam forming system, according to simulating parameter information. It can greatly reduce on the costs, such as rental for a place and labor. The simulating field trial proceeds without a specific real space. Therefore, the advantages of the simulating measurement apparatus and method of the invention are low in space requirement, low in setting cost and high in accuracy. It is beneficial for forming a radio beam forming system.

The objective of the present invention will no doubt become obvious to those of ordinary skill in the art after

BRIEF DESCRIPTION OF THE APPENDED DRAWINGS

DETAILED DESCRIPTION OF THE INVENTION

Figure 1:
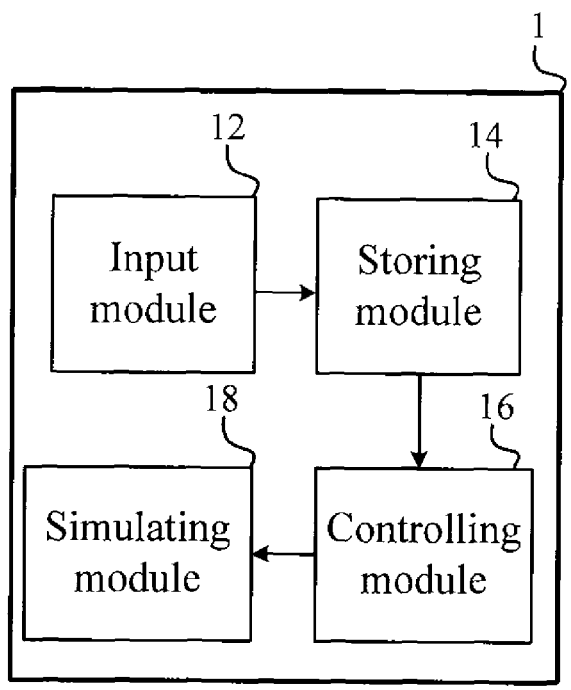
FIG. 1 illustrates functional blocks of simulating measurement apparatus according to one embodiment of the invention.

The invention provides a simulating measurement apparatus and a method for simulating the transmitting behavior of a plurality of RF signals generated by a radio beam forming system.

The simulating measurement apparatus and method generate a simulating result by evaluating the transmitting behavior of a plurality of RF signals. The apparatus and method can reduce the costs of the rent and manpower. Field trial does not need to be processed in a specific real space.

To begin, we will discuss the art and theory of a radio beam forming system. For a far-field receiving and emitting system, if an antenna is isotropic, it means that the antenna pattern is symmetric and it cannot transmit directionally. There are various kinds of directional antennas including dish antennas, antenna arrays, and so on.

If the system uses an antenna array, the antenna array is directional under beforehand plan, whether each antenna is directional or not. While directional emits antennas emit radio, they can also emit signals toward some direction due to anti-symmetric pattern of emitting antenna. While the directive receiving antenna receives RF signals, the receiving antenna can recognize the direction of the emitting source of the space signal.

The patterns of antenna are hereby introduced. The so-called antenna patterns can be regarded as the magnitude and phase of each RF signal in space while emitting the RF signals through the emitting antenna. The patterns are also regarded as the loss and phase performance of the RF signals in all directions in space while receiving the RF signals through the receiving antenna.

If there is an apparatus which can control and change the magnitude of the RF signal attenuating and phase change in each transmitting path, it can simulate the transmitting behavior of the RF signal in the real space between emitting antenna and receiving antenna. The simulating measurement and method of invention is based on the abovementioned theory.

Any pattern of emitting/receiving antenna may be acquired by measuring and the date of art. The patterns of emitting/receiving antenna are stored on memory and perform emitting/receiving behaviors in a way similar to table look-up.

For example, if there is a directional emitting antenna, the decibel of forehand signal is 10 dB higher than the signal in other directions. Traditionally, the evaluating method of the emitting antenna in a non-reflection chamber is that the emitting antenna has to emit signals and a receiving antenna is set with some distance from receiving antenna to receive the signals from the emitting antenna. Emitting antenna is rotated to receive and then note the magnitude of signals in all directions. If the measurement result is correct, the decibel of recorded signals is 10 dB higher than other directions.

In theory, Space coordinates will correspond to the magnitude and the phase of a unique RF signal. It may be regarded as a function. Generally, the variations of amplitude and phase difference of the RF signals between input/output and transmitting/receiving in a radio beam forming system are used to generate a directional pattern antenna in far field. The directions and shapes of the radio beam can be controlled by changing the variations. If the antenna array includes m antennas, the RF signals can be represented as {RF(a1,φ1,t), RF(a2,φ2,t), . . . , RF(am,φm,t)} wherein a represents amplitude and φ represents phase.

Notably, the simulating measurement apparatus and method of the invention is that extra controlled signals change the magnitude of amplitude attenuating and phase difference in each transmitting path. In other words, the RF signals received by receiving antenna are represented as {RX(a11, φ11,t),RX(a12,φ12,t), . . . , RX(aij,φij,t), . . . , RX(amn,φmn,t).

The array antenna of emitting port includes m antennas which are represented as m. The antenna array of receiving port includes n antennas which are represented as n. RX(aij, φij,t), which represents the magnitude of amplitude attenuating and phase difference during the ith emitting antenna emitting RF signals to the jth receiving antenna at time t.

The RF signals received by the jth receiving antenna is represented as $$\sum_{i=1}^{m} RF(a_i, \varphi_i, t) RX(a_{ij}, \varphi_{ij}, t)$$

While the RF signals' transmitting performance measurement of M*n (m emitting antennas and n receiving antennas) receiving-emitting antennas is proceeding, the user can input some simulating parameter information such as receiving/transmitting antenna patterns, the directions and distance between receiving antenna and transmitting antenna, and channel effect.

Input the RF signals acquired through the simulating measurement apparatus of the invention as {RF(a1,φ1,t), RF(a2, φ2,t), . . . , RF(am,φm,t)}. Through operating and simulating the effect of {RX(a11,φ11,t), RX(a12,φ12,t), . . . , RX(aij,φij, t), . . . , RX(amn,φmn,t)}, the magnitudes of amplitude attenuating and phase difference of the RF signals are generated. The terminal output RF signals of the simulating apparatus are with the form as formulas.

The simulating measurement apparatus can replace traditional apparatus of a radio beam forming system with the same measurement results. Besides reducing costs on manpower and rent, it can improve the ability of repeating and consistency.

According to one embodiment of the invention that provides a simulating measurement apparatus, the simulating measurement apparatus for a radio beam forming system generates a simulating measurement result by simulating the transmitting behavior of a plurality of RF signals. The radio beam forming system is used to emit a plurality of RF signals from an emitting apparatus to a receiving apparatus.

In practice, the emitting apparatus comprises a plurality of emitting units and each of the plurality of emitting units emits one of the plurality of RF signals individually. Moreover, each of the plurality of RF signals has its individual amplitude and phase.

FIG. 1 illustrates functional blocks of simulating measurement apparatus according to one embodiment of the invention. Referring to FIG. 1, simulating measurement apparatus includes input module 12, storing module 14, controlling module 16, and simulating module 18. Later, the modules of simulating measurement apparatus 1 and their functions are described in details.

Initially, the input module 12 is provided to input simulating parameter information for users. In one embodiment, the simulating parameter information comprises at least one emitting apparatus simulating parameters, at least one receiving apparatus simulating parameter, and a radio beam channel transmitting simulating parameter. In practice, the simulating parameter information may be receiving/transmitting antenna patterns, the directions and distance between receiving antenna and transmitting antenna, and channel effect parameters. Storing module 14 connecting to input module 12 is used to store a simulating parameter module. In practice, the storing module 14 can be a simulating parameter date bank.

In one embodiment, the controlling module 16 connects to storing module 14 and generates controlling signals according to simulating parameter information. In practice, controlling module 16 is a computer system or an embedded microprocessor. Simulating module 18 connects to controlling module 16 and generates a simulating measurement result by simulating the transmitting behavior of the plurality of RF signals according to the controlling signals.

Figure 2:
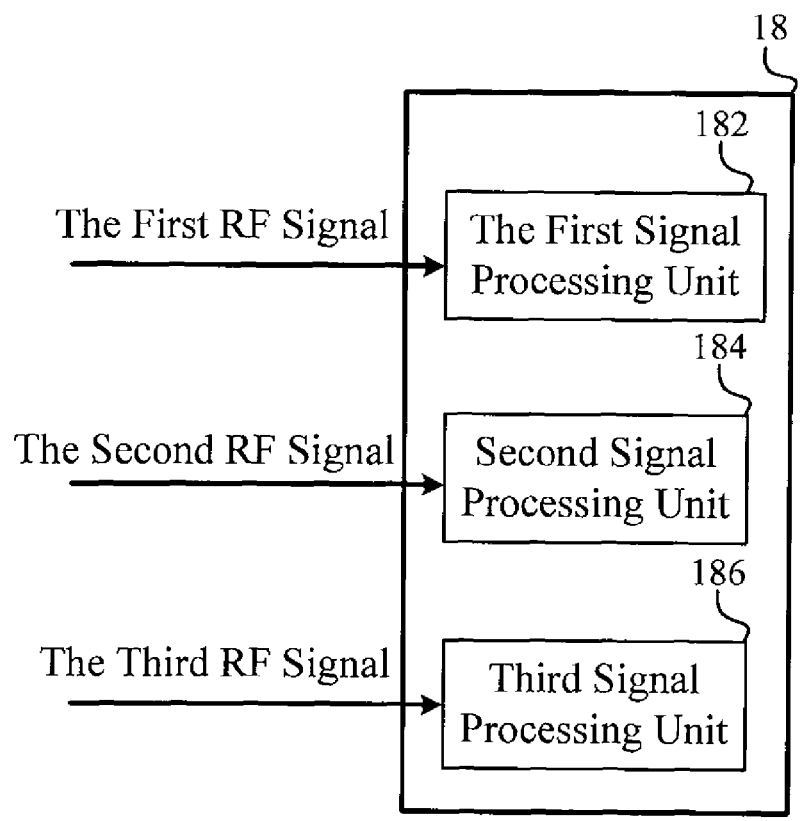
FIG. 2 illustrates detailed functional blocks of the simulating module shown in FIG. 1.

In practice, simulating module 18 comprises at least one signal processing unit. Referring to FIG. 2, in one embodiment, simulating module 18 includes the first signal processing unit 182, the second signal processing unit 184, and the third signal processing unit 186 wherein each of the at lease one signal processing units processes one of the plurality of RF signals individually. The first signal processing unit 182 processes the first RF signal; the second signal processing unit 184 processes the second RF signal; and the third signal processing unit 186 processes the third RF signal. In practice, the number of signal processing units comprised simulating module 18 that corresponds to the number of the RF signals in different paths.

Moreover, the first signal processing unit 182, the second signal processing unit 184, and third signal processing unit 186 have each a phase shifter and a RF attenuator. The phase shifter simulates the phase shifter of the RF signals according to the simulating parameter information; the RF attenuator simulates the amplitude attenuating of the RF signals according to the simulating parameter information.

Figure 3:
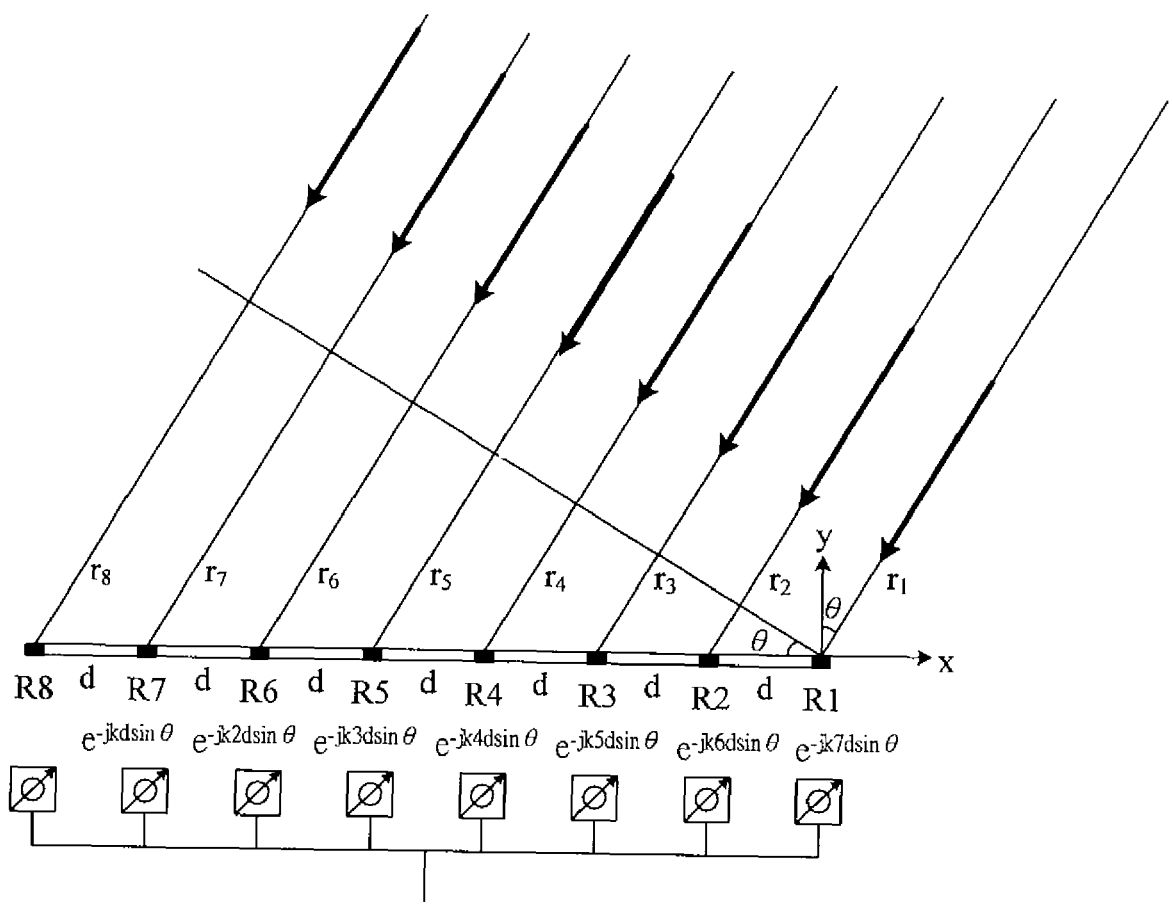
FIG. 3 illustrates 8*1 antenna array receiving far field RF signals.

FIG. 3 illustrates 8*1 antenna array receiving far field RF signals. Referring to FIG. 3, if the interval between two receiving antennas is d, and y axis is at an angle θ of zero degree to transmitting path of the RF signals, the received signals from receiving antennas R1 to R8 can be regarded as the same. If θ isn't zero, the needed time for the RF signals transmitted through different transmitting paths reaching to the respective receiving antenna will be different.

For instance, the first RF signal reaches the first receiving antenna R1 and then the second RF signal reaches the second receiving antenna R2 after (d sin θ)/c seconds passed by. The phase difference between the first RF signal and the second RF signal is kd sin θ. When k=2π/λ, the phase difference between the first RF signal and the nth (n≦8) RF signal is k(n−1) sin θ.

The magnitude of the phase shift of the phase shifter in the eighth transmitting path is e−jknd sin θ. Wherein the angel θ can be adjusted to make it equal to the direction of the radio beam formed by the antenna array, total receiving energy can achieve maximum.

Referring to FIG. 3, on a basic of phase shift in the eighth transmitting path, the phase shift in the seventh transmitting path is e−jkd sin θ and the phase shift in the sixth transmitting path is e−jk2d sin θ. By this way, the phase shift in the first transmitting path is e−jk7d sin θ and the total receiving energy can achieve the maximum with θ equal to zero.

In practice, the user inputs simulating parameters such as the phase and attenuating intensity of the RF signals by input module 12. After controlling module 16, which controls simulating module 18, to simulate the effect of {RX(a11,φ11, t), RX(a12,φ12,t), . . . , RX(aij,φij,t), . . . , RX(amn,φmn,t)} by generating controlling signals for simulating module 18 according to simulating parameters. The respective magnitudes of phase variation and amplitude attenuating of the RF signal are generated. The terminal output RF signals of the simulating apparatus are with the form as formulas.

According to another embodiment of the invention is provided a method for simulating measurement. In one embodiment, the radio forming system is used to emit a plurality of RF signals from an emitting apparatus to a receiving apparatus.

In practice, the emitting apparatus comprises a plurality of emitting units and each of the plurality of emitting units emits one of the plurality of RF signals individually. Moreover, each of the plurality of RF signals has its individual amplitude and phase.

Figure 4:
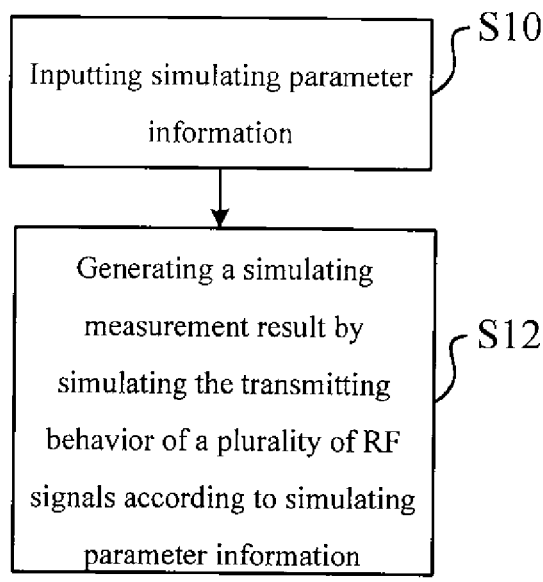
FIG. 4 illustrates a flow chart of simulating measurement method according to another embodiment of the present invention.

FIG. 4 illustrates a flow chart of simulating measurement method according to another embodiment of the present invention. Referring to FIG. 4, the simulating measurement method is to execute step S10 and then inputs the simulating parameter information. In practice, the simulating parameter information comprises at least one emitting apparatus simulating parameters, at least one receiving apparatus simulating parameter, and a radio beam channel transmitting simulating parameter. The simulating parameter information may be receiving/transmitting antenna patterns, the directions and distance between receiving antenna, transmitting antenna, and channel effect parameters. Thereafter, step S12 is executed to generate a simulating measure result by simulating the transmitting behavior of a plurality of RF signals according to simulating parameter information.

Figure 5:
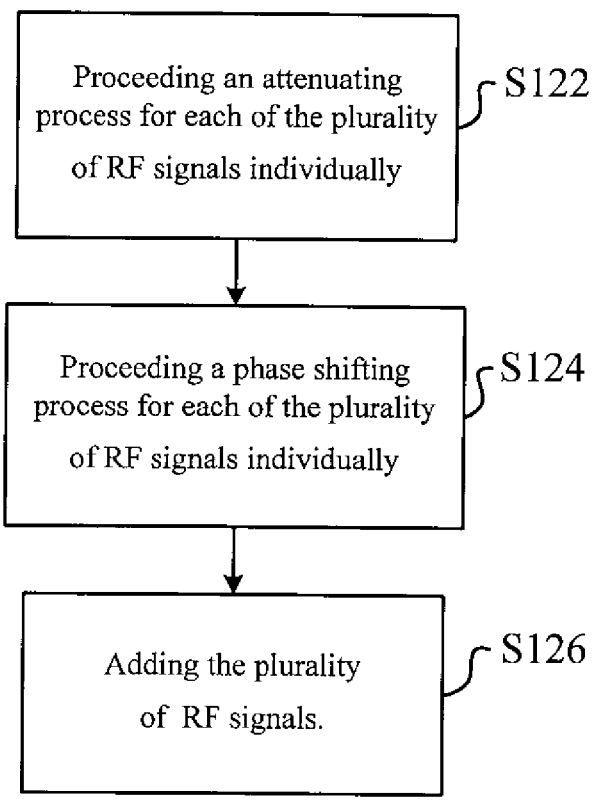
FIG. 5 illustrates a detailed flow chart of step S12 shown in FIG. 4.

FIG. 5 illustrates a detailed flow chart of step S122 shown in FIG. 4. Referring to FIG. 5, step S122 is executed to attenuate each of the plurality of RF signals. Thereafter, step S124 is executed to shift phase of each of the plurality of RF signals. In practice, the order of the simulating measurement method for executing step 122 and step 124 isn't confined. Besides executing step 122 before step 124, step S122 is also executed after step S124. Step S126 of the simulating measurement method is executed to generate a simulating measurement result by adding to the plurality of RF signals.

Accordingly, yet another embodiment of the invention provides a simulating measurement apparatus for a radio beam forming system used to emit a plurality of RF signals from an emitting apparatus to a receiving apparatus. The simulating measurement apparatus consists of a plurality of phase shifters and RF attenuators and generates a signal simulating result by simulating the plurality RF signals transmitting from an emitting apparatus to a receiving apparatus according to a simulating parameter. In one embodiment, the simulating parameters are related to phase change and signal attenuating in the space between an emitting antenna and a receiving antenna.

Compared to the prior art, the simulating measurement apparatus and method of the invention are to generate a simulating measurement result by simulating the transmitting behavior of a plurality of RF signals in a radio beam forming system according to simulating parameter information. It can reduce the costs of the rental and manpower. The simulating field trial is proceeded without a specific real space. Therefore, the advantages of the simulating measurement apparatus and method of the invention are low in space requirement, low in setting cost, and high in accuracy. It is beneficial to form a radio beam forming system.

Although the present invention has been illustrated and described with reference to the preferred embodiment thereof, it should be understood that it is in no way limited to the details of such embodiment but is capable of numerous modifications within the scope of the appended claims.

What is claimed is:

1. A simulating measurement apparatus for a radio beam forming system used to emit a plurality of RF signals from an emitting apparatus to a receiving apparatus, the simulating measurement apparatus comprising:
   a storing module for storing simulating parameter information that comprises at least one emitting simulating parameter, at least one receiving simulating parameter, and a radio beam channel transmitting simulating parameter;
   a controlling module, connecting to the storing module, for generating a controlling signal according to the simulating parameter information; and
   a simulating module, connecting to the controlling module, for generating a simulating measurement result by simulating the transmitting behavior of the plurality of RF signals according to the controlling signal.

2. The simulating measurement apparatus of claim 1, further comprising:
   an input module, connecting to the storing module, for an user to input the simulating parameter information.

3. The simulating measurement apparatus of claim 1, wherein the emitting apparatus comprises a plurality of emitting units, and each of the plurality of emitting units emits one of the plurality of RF signals individually.

4. The simulating measurement apparatus of claim 1, wherein each of the plurality of RF signals has its individual amplitude and phase.

5. The simulating measurement apparatus of claim 1, wherein the simulating module comprises at lease one signal processing unit.

6. The simulating measurement apparatus of claim 5, wherein each of the at lease one signal processing units processes one of the plurality of RF signals individually.

7. The simulating measurement apparatus of claim 5, wherein each of the at least one signal processing units comprises a phase shifter and a RF attenuator individually.

8. The simulating measurement apparatus of claim 1, wherein the controlling module is a computer system or an embedded microprocessor.

9. A simulating measurement method for a radio forming system used to emit a plurality of RF signals from an emitting apparatus to a receiving apparatus, the simulating measurement method comprising:
   (a) inputting the simulating parameter information that comprises at least one emitting apparatus simulating parameters, at least one receiving apparatus simulating parameter, and a radio beam channel transmitting simulating parameter; and
   (b) generating a simulating measurement result by simulating the transmitting behavior of the plurality of RF signals according to the simulating parameter information.

10. The simulating measurement method of claim 9, comprising:
    (b1) proceeding an attenuating process for each of the plurality of RF signals individually;
    (b2) proceeding a phase shifting process for each of the plurality of RF signals individually; and
    (b3) adding the plurality of RF signals.

11. The simulating measurement method of claim 9, wherein the emitting apparatus comprises a plurality of emitting units, and each of a plurality of the emitting units emits one of the plurality of RF signals individually.

12. The simulating measurement method of claim 9, wherein each of the plurality of RF signals has its individual amplitude and phase.

13. A simulating measurement apparatus, for a radio beam forming system used to emit a plurality of RF signals from an emitting apparatus to a receiving apparatus, consisting of a plurality of phase shifters and RF attenuators, for generating a signal simulating result by simulating the plurality of RF signals transmitting from an emitting apparatus to a receiving apparatus according to a simulating parameter.

14. The simulating measurement apparatus of claim 13, wherein the simulating parameters are related to phase change and signal attenuating in the space between an emitting antenna and a receiving antenna.

15. A simulating measurement apparatus for a radio beam forming system used to emit a plurality of RF signals from an emitting apparatus to a receiving apparatus, the simulating measurement apparatus comprising:
    a controlling module, for generating a controlling signal according to simulating parameter information; and
    a simulating module, connecting to the controlling module, for generating a simulating measurement result by simulating the transmitting behavior of the plurality of RF signals according to the controlling signal.

16. The simulating measurement apparatus of claim 15, wherein the simulating parameter information comprises at least one emitting apparatus simulating parameter, at least one receiving apparatus simulating parameter, and a radio beam channel transmitting simulating parameter.

17. The simulating measurement apparatus of claim 15, further comprising:
    a storing module, connecting to the controlling module, for storing the simulating parameter information.

* * * * *